United States Patent [19]

Jensen

[11] Patent Number: 4,829,404
[45] Date of Patent: May 9, 1989

[54] METHOD OF PRODUCING A FLEXIBLE CIRCUIT AND MASTER GRID THEREFOR

[75] Inventor: Reece C. Jensen, Los Gatos, Calif.
[73] Assignee: Flexmark, Inc., Fremont, Calif.
[21] Appl. No.: 71,562
[22] Filed: Apr. 27, 1987
[51] Int. Cl.[4] .......................... H05K 1/00; H05K 3/00
[52] U.S. Cl. ...................... 361/398; 29/846; 174/68.5; 361/400; 361/409; 361/416
[58] Field of Search ............... 83/30, 31; 29/846, 852; 269/904, 903; 174/68.5; 200/1 R, 5 R, 5 A, 159 B, 292; 361/397, 398, 400, 403, 404, 408, 409, 410, 411, 412, 414, 416, 417, 418

[56] References Cited

U.S. PATENT DOCUMENTS

| | | | |
|---|---|---|---|
| 3,290,558 | 12/1966 | Sapy | 361/398 X |
| 3,364,300 | 1/1968 | Bradham | 361/416 X |
| 3,564,115 | 2/1971 | Gribble et al. | 361/409 X |
| 3,718,936 | 2/1973 | Rice, Jr. | 361/410 X |
| 3,886,335 | 5/1975 | Hendricks | 200/5 A X |
| 4,055,735 | 10/1977 | Eachus et al. | 200/5 A |
| 4,371,744 | 2/1983 | Badet et al. | 361/410 X |
| 4,510,353 | 4/1985 | Nemitz | 200/5 A |

Primary Examiner—J. R. Scott
Attorney, Agent, or Firm—Flehr, Hohbach, Test, Albritton & Herbert

[57] ABSTRACT

A method of producing a flexible circuit in a predetermined pattern includes in one embodiment utilizing a flexible circuit master grid which has, on a roll of insulating material, successive grid patterns of switch arrays connected to one another. By interrupting some of the circuit paths the remaining circuit paths will provide an overall flexible circuit pattern which can than be cut out of the roll. In another embodiment a simplified flexible circuit master grid can also include orthogonal conductors arranged on the front and back of the flexible insulating layer plated with holes connecting each front conductor to a corresponding back conductor. A flexible circuit pattern is then constructed by cutting along the boundary edges of the arrays.

16 Claims, 10 Drawing Sheets

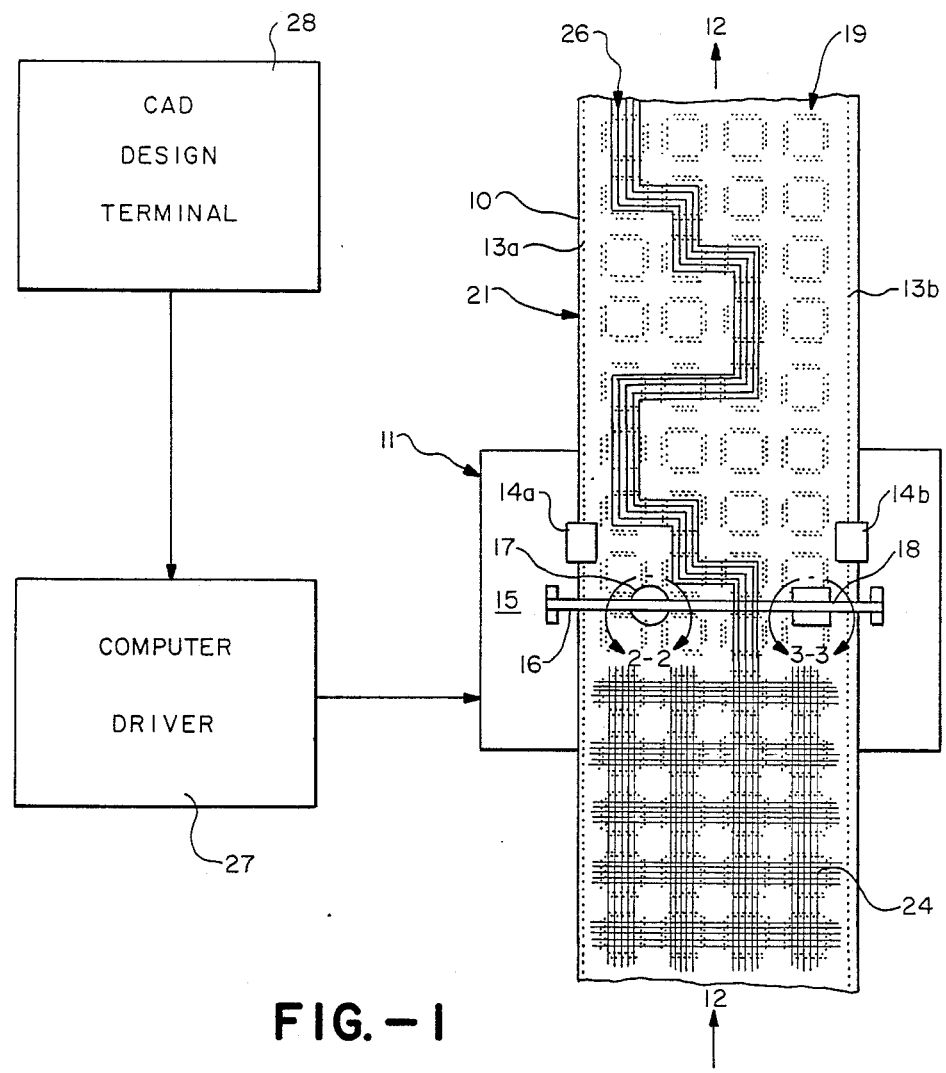
FIG.—1
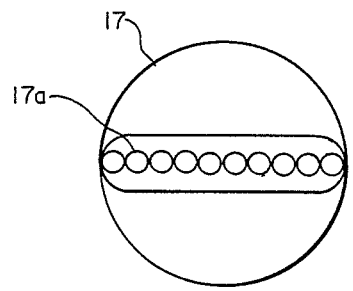
FIG.—2
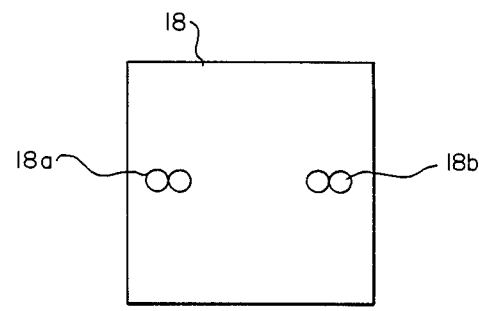
FIG.—3

○ CLOSED
⊗ OPEN

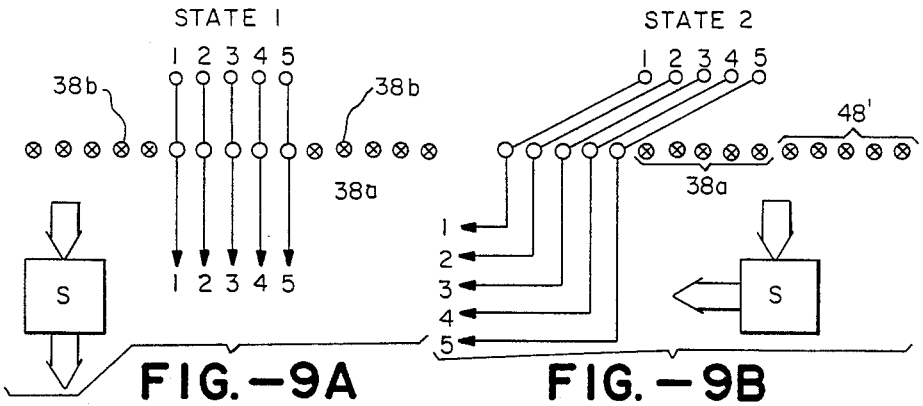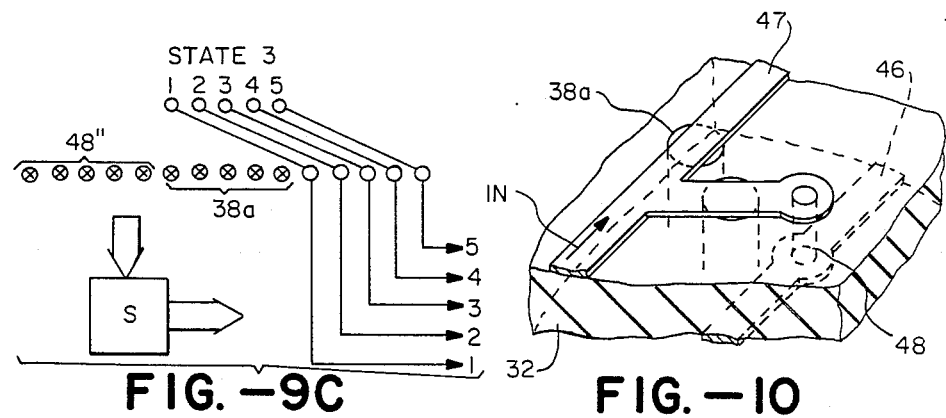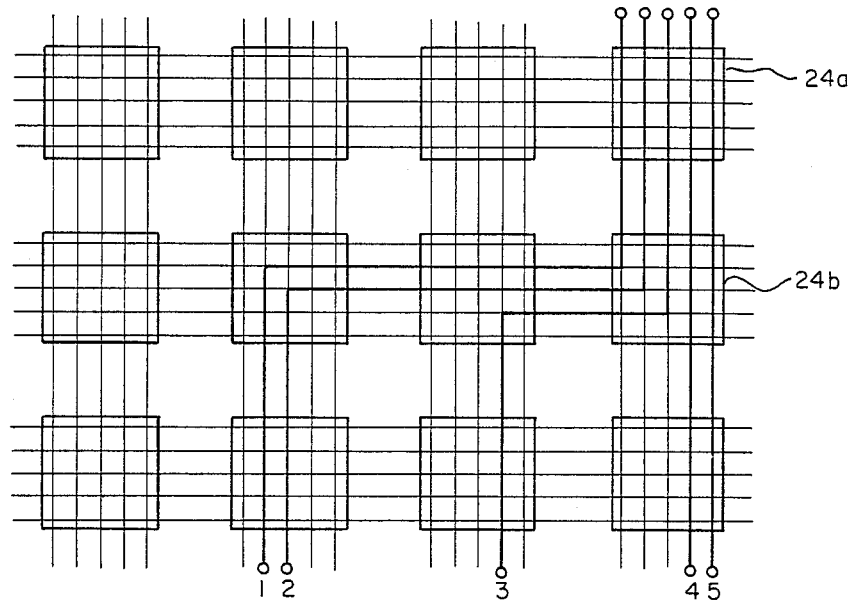

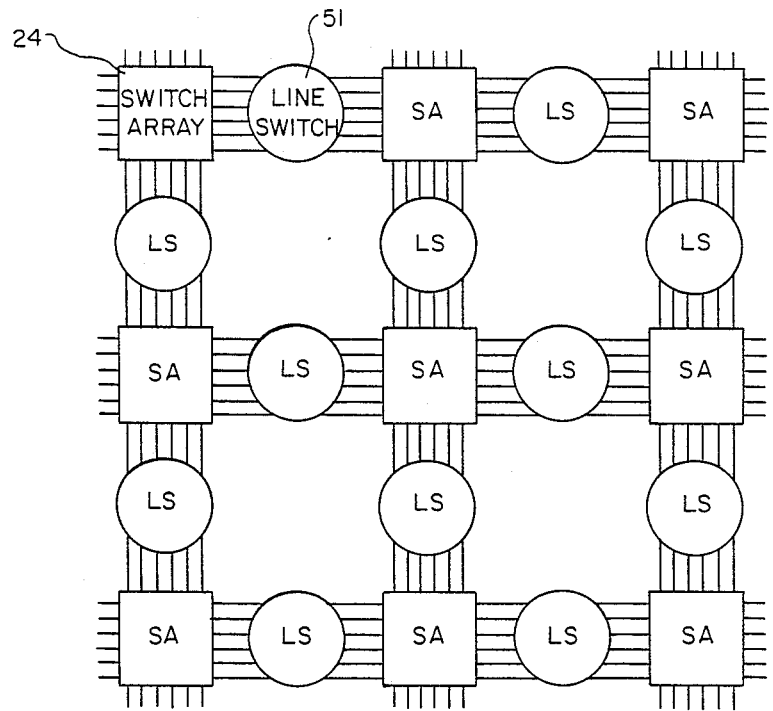
FIG.—12
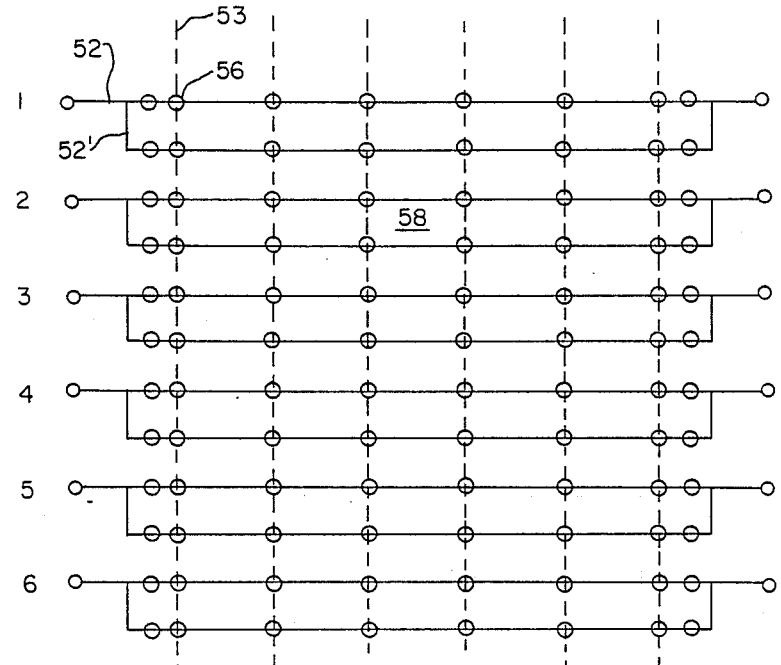
FIG.—13A

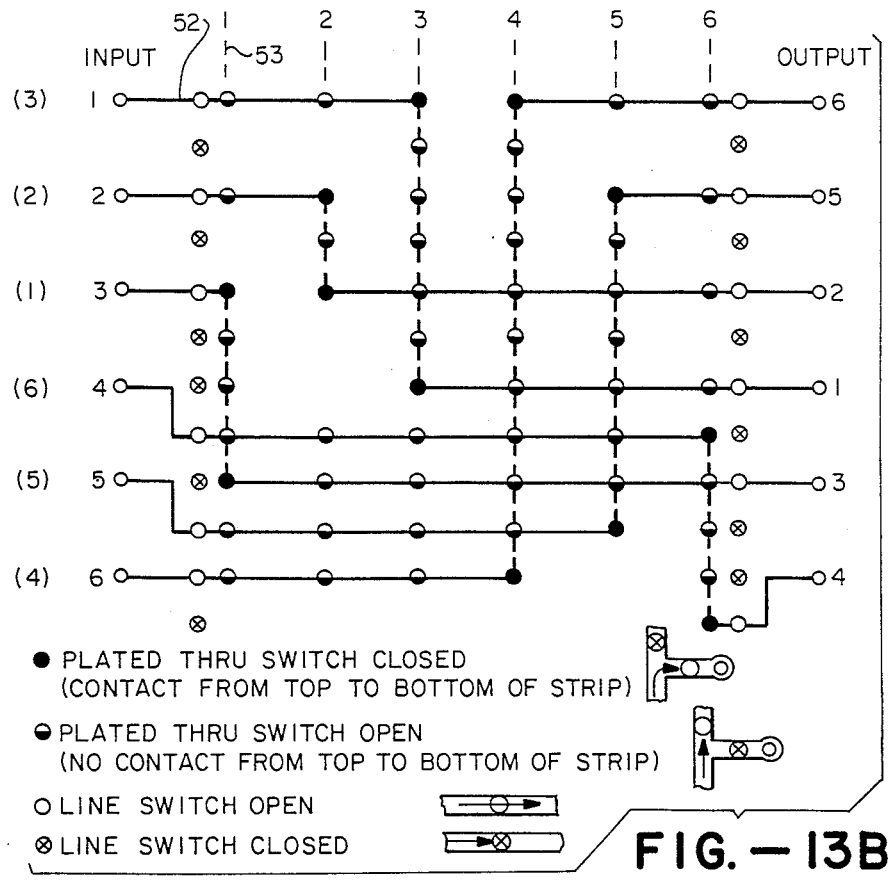
- ● PLATED THRU SWITCH CLOSED
  (CONTACT FROM TOP TO BOTTOM OF STRIP)
- ◐ PLATED THRU SWITCH OPEN
  (NO CONTACT FROM TOP TO BOTTOM OF STRIP)
- ○ LINE SWITCH OPEN
- ⊗ LINE SWITCH CLOSED
FIG.—13B
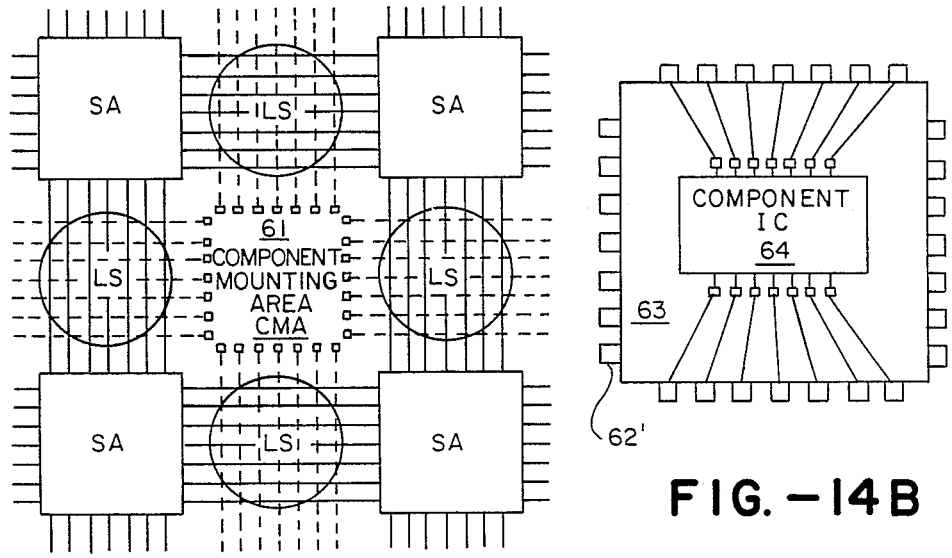
FIG.—14A
FIG.—14B

METHOD OF PRODUCING A FLEXIBLE CIRCUIT AND MASTER GRID THEREFOR

The present invention is directed to the method of producing a flexible circuit incorporating the use of a flexible circuit master grid.

Flexible circuits are typically a precision-etched foil wiring assembly which include a flexible insulating layer of, for example, Kapton, on which copper conductors have been etched. The circuits include interconnecting pads or pinholes or other suitable adapters for the interconnection of various electrical components typically arranged in a high density electronics package.

At the present time, such flexible circuitry is custom produced which is especially expensive in low quantities. In any case, for each type of electronic circuit package, a specialized flex circuit, if one is to be used, must be designed and built.

OBJECT AND SUMMARY OF THE INVENTION

It is, therefore, a general object of the present invention to provide an improved method of producing a flexible circuit.

Another object of the invention is to provide a flexible circuit master grid of a type which is suitable for use in the above improved method.

In accordance with the above objectives there is provided a method of producing a flexible circuit for use in interconnecting electrical components having a flexible insulating layer carrying conductor strips, the layer being cut in a predetermined planar pattern to provide a circuit path. The method comprises the steps of providing a grid pattern of switch arrays on the flexible insulating layer which each of the switch arrays having a matrix of parallel conductors electrically connected by conductive path means to matrices of adjacent switch arrays. These conductive path means are selectively interrupted to at least one of the adjacent switch arrays whereby a circuit path is established. The portion of the flexible insulating layer carrying the circuit path is then physically separated whereby a flexible circuit is produced.

There is also provided for use in the above method a flexible circuit master grid comprising an elongated flexible insulating layer. On this insulating layer there is at least one grid pattern of switch arrays, each of the switch arrays having a matrix of parallel conductors electrically connected by conductive path means to matrices of adjacent switch arrays. Each of these switch arrays include means for interrupting the conductive path means to at least one of the adjacent switch arrays whereby a circuit path is established.

DESCRIPTION OF THE DRAWINGS

FIG. 1 is a schematic block diagram including a plan view of a flexible circuit master grid showing the method of the present invention.

FIG. 2 is a cross-sectional view taken substantially along the line 2—2 of FIG. 1.

FIG. 3 is a cross-sectional view substantially taken along the line 3—3 of FIG. 1.

FIGS. 9A, 9B and 9C are circuit schematics illustrating various switching permutations of FIG. 8.

FIG. 10 is a perspective view of a switch array, with a portion broken away, taken along line 10—10 of FIG. 8.

FIG. 11 is a simplified block diagram based on the grid pattern of FIG. 1 showing an alternative method.

FIG. 12 is a plan view showing an alternative to the grid pattern as shown in FIG. 1.

FIG. 13A is a plan view illustrating typical electrical circuit switching connections in the line switches of FIG. 12.

FIG. 13B is a plan view illustrating a particular electrical circuit switch indicating the circuit paths.

FIG. 14A is a plan view of an alternative grid pattern to FIG. 12.

FIG. 14B is a plan view of a component mounted on FIG. 14A.

DETAILED DESCRIPTION OF PREFERRED EMBODIMENTS

Figure 4:
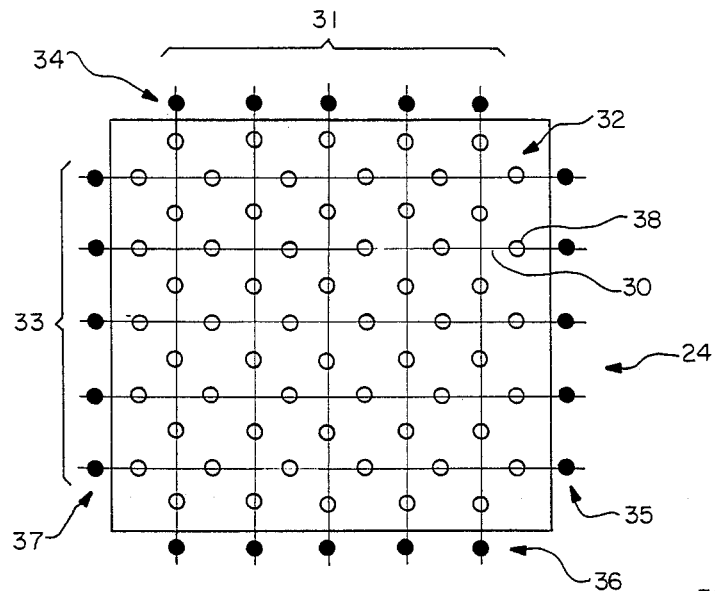
FIG. 4 is a plan view of one of the switch arrays of FIG. 1.

FIG. 1 illustrates at 10 a flexible circuit master grid which is in the form of a long roll movable on a tractor device 11 in the direction of arrow 12. The master grid 10 includes left and right perforations 13a, 13b which mesh with and are driven by the tractor feed device 14a, 14b mounted on a resilient platen 15.

Feeder device 11 also includes a carriage bar 16 transverse to the direction of movement 12 of master grid 10 which carries a pin punch 17 and an outline punch 18. Platen 15 forms a rebound or cutting surface for these punches. Alternatively, the platen could have preformed holes to accommodate the punches.

Master grid 10 is basically composed of a flexible insulating layer 19 (e.g., KAPTON or other Mylar types of base materials) in the form of a continuous roll having a checkerboard like grid pattern 21. The grid pattern includes a plurality of switch arrays 24 with a matrix of orthogonal parallel conductors which are electrically connected as generally illustrated to adjacent switch arrays.

Referring to FIG. 2, pin punch 17 has a number of shaped pins 17a which are utilized for interrupting electrical connections between various switch arrays 24 as will be described in greater detail below. And as illustrated in FIG. 3 an outline punch 18 includes by way of schematic example two pairs of punches 18a and 18b, which are utilized for forming a profile of the flexible circuit path established by the pin punch 17, as for example, illustrated by the circuit path 26. In other words, the outline punch 18 perforates along the sides of the various switch arrays 24 to remove most of the insulating material and to partially separate out the circuit path 26 from the remainder of the unused master grid. Actually the punches 18a and 18b must physically be of greatest punching strength compared to the pins 17a, since they must perforate through the entire flexible sheet. In general, the specific pins 17a may be of the order of 5 to 25 mils in diameter with various shape tips, and it can be activated by magnetic as well as pneumatic and other means. As it travels along the carriage bar 16, it is activated at the proper time by the associated computer driver 27 which may be a simple microprocessor controller.

Computer driver 27 receives instructions and interacts with computer aided designed terminal 28 where the user through the use of a keyboard, for example, and a video terminal can design the type of circuit path and the resulting flexible circuit to be cut out or delineated on the master grid 10. The design terminal displays for the user the grid available for the particular type of base flex material being used.

FIG. 4 shows one embodiment of a switch array 24. It is in a form of a cross-bar switch having a set of five parallel conductors strips 31 which have been etched on the insulating base 32 and along with a perpendicular conductor set 33. All of the conductors of set 31 are electrically connected to every conductor of set 33 at the crossing points 30. There are four sets of connecting pads indicated at 34, 35, 36 and 37. The pads may be merely enlarged portions of the strip conductor, pin type connectors or other known connecting techniques. Thus, electrical components may easily be mounted at any switch array.

Figures 5A, 5B, 5C, 5D:
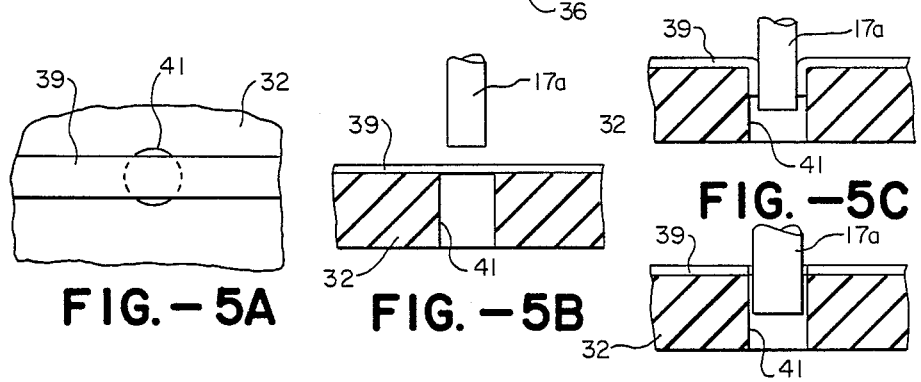
FIG. 5A, 5B, and 5C are a sequence, partially in plan view and partially in cross-section, of portions of FIG. 4 showing an interruption of a circuit.
FIG. 5D shows an alternative technique for interruption.

Switching is provided between the various conductors and more specifically on switch array 24 by the circled switch area indications 38. A typical switch is shown in FIGS. 5A and 5B where a strip conductor 39 overlays a perforation in insulating layer 32 which has a diameter larger than the strip 39. The switch connection which is normally closed may be opened by activation of a pin 17a (FIGS. 1 and 2) which has a diameter essentially the same or slightly larger than the conductor 39. When actuated the electrical circuit is interrupted as shown in FIG. 5C, pin 17a perforating the copper strip conductor 39 and pushing the resultant ends into aperature 41. In other words, the strip is broken and folded into the aperture 1. Other techniques are equally applicable where a section can be punched out of or totally removed from conductor 39 as shown in FIG. 5D. A pneumatic device, laser cutter, or circular saw could also be used to remove a section of the trace in order to provide the desired circuit interrupt.

In operation, briefly referring to FIGS. 1 and 2, thus the pin punch 17 under the control of computer driver 27 is indexed from one switch area 38 to the next across a line beneath the carriage bar 16. As the head of pin punch traverses across the master grid pattern 10, the outline punch 18 concomitantly punches a series of holes in the grid pattern 10 which outline the shape or pattern of the flexible circuit.

Normally, the outline punches 18 are actuated only eight to ten times during the traverse across the base material. After making a complete traverse across the flexible insulating material, the roll or elongated strip 10 is indexed by the tractor feed 14a, 14b to the next line. Thus, this is repeated until the entire flexible circuit is electrically configured and its outline externally punched. For example, such outline is shown by circuit path 26 and is easily removed from the roll 10 by breaking the remaining connections.

The circuit path 26 illustrated is, of course, very simple and the typical flex circuit might include multiple paths. Also and most importantly, the illustrated number of parallel conductors and switch arrays can be vastly increased. For example, the number of parallel conductors may range from 20 to over 100. Thus, complicated flexible circuits can be constructed by the technique of the present invention.

Figure 6A:
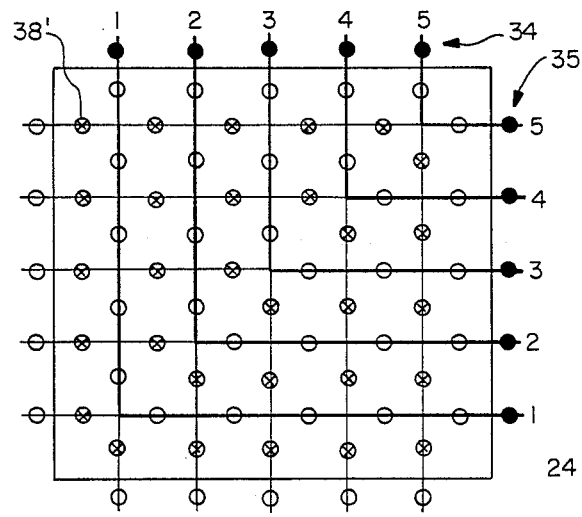
FIG. 6A is a plan view of a portion of FIG. 4 but showing FIG. 4 after certain circuits have been interrupted.
Figure 6B:
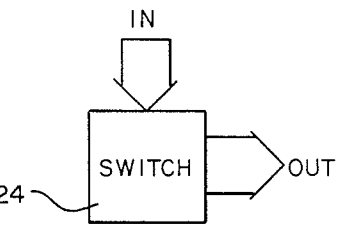
FIG. 6B is a schematic showing the pattern of conductive interruption of FIG. 6A.

FIG. 6 illustrates the switch array 24 of FIG. 4 which has been switched by various circuit interruptions to provide an input at the top as indicated and making a left turn for the output as indicated schematically in FIG. 6A. The conductor paths are emphasized by the darkened lines. In order to provide this type of switching, all of the interrupts shown by the circled (x) switches 38' and as indicated by the adjacent legend must be operated upon by the pin 17a. Note in the five circuit paths themselves, all of the strip conductors are indicated as being closed. And the contact pad set 34 and 35 in the flex circuit can be utilized for making connection to appropriate electrical components.

Figure 7:
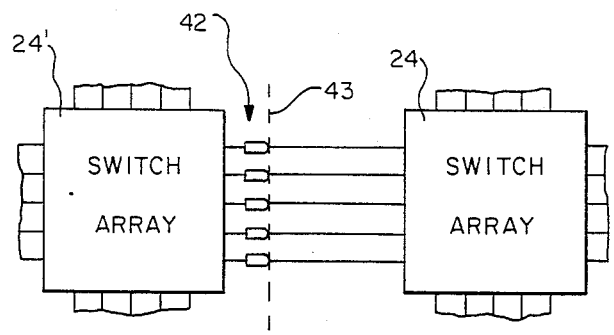
FIG. 7 is a block schematic showing an alternative embodiment of circuit interconnections between switch arrays.

FIG. 7 shows an alternative contact pads where the switch arrays 24' is provided with contact pads 42 where the copper strip conductor has had its width and depth increased to form in effect a standard pin connector. Then by cutting on the line 43 this forms the pin connector where, after any covering or protective material is removed to expose the pins, they can directly be used as an interface for mating the flexible circuit directly to a circuit board or other similar electrical part.

Referring briefly again to FIG. 6, it is apparent that by proper circuit interruptions (by means of the switches shown at areas 38) a circuit path can be selected which passes straight through the switch in the same direction as the input or a left or right turn. At the same time these choices are made, the conductive paths to other adjacent switch arrays are interrupted. In addition, the path of the five exemplary conductors can be split into several different paths (three paths) straight through left and right.

FIG. 11 indicates such a split where an initial switch array 24a provides a straight through connection and then in switch array 24b, there is a right turn by three of the lines, and so on. The reverse can also be accomplished where the circuit paths begins at different locations.

Figure 8:
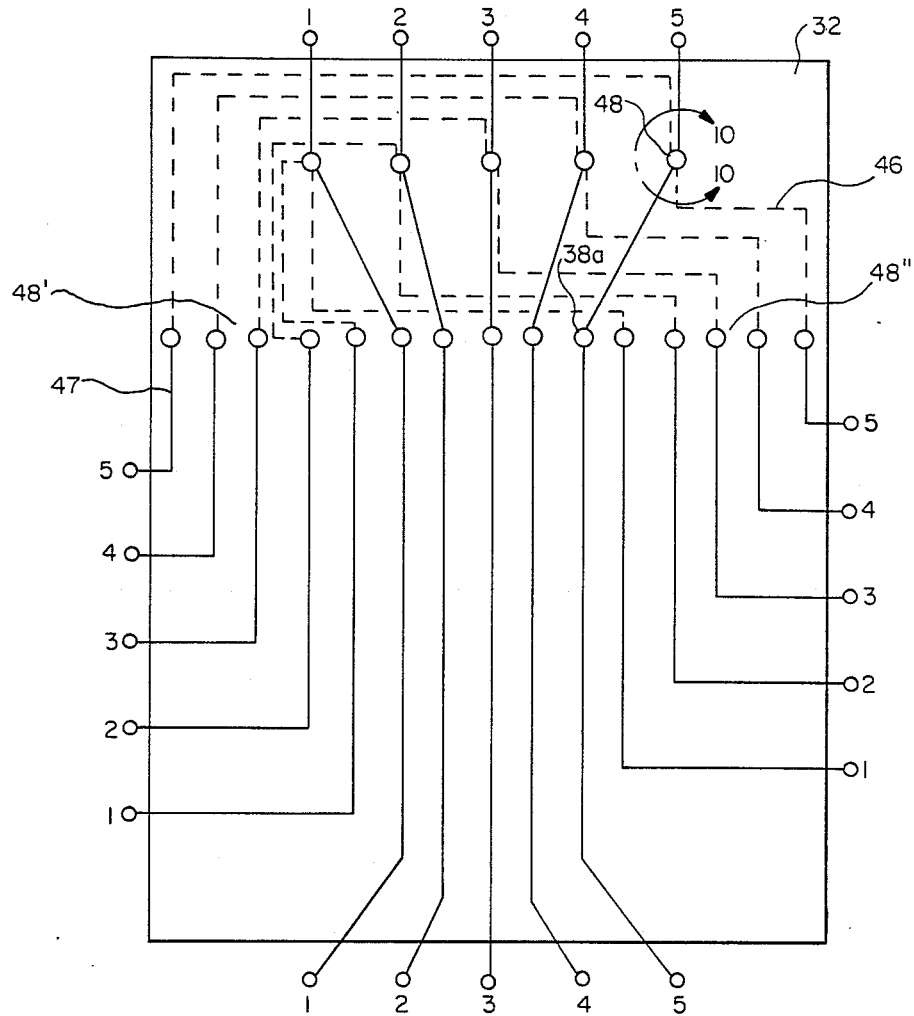
FIG. 8 is a plan view of an alternative embodiment of the switch array of FIG. 4.

FIG. 8 illustrates an alternative switching arrangement for a switch array 24 in that it requires fewer switch interruptions to be made to provide for left, right or direct through switching and for interruption of conductive paths to adjacent switch arrays. However, this is only provided if the insulating layer 32 can be plated with copper conductors on both sides. Thus, the conductors on the top side of flexible insulated layer 32 are indicated by solid lines 47 and on the under side by dashed lines 46. However, from a connection point of view there are still five input terminals, numbered 1 through 5, with possible straight through left or right connectors or partial variations of these as in the case of FIG. 6. Because of the dashed conductors 46 on the underside of insulating layer 32, a through connection must be provided between the underside conductors 46 and those on the top 47. This is illustrated in FIG. 10 where the through connection of, for example, conductor 5, is typically illustrated. This includes the plated through hole 48 connecting the two conductors 46 and 47, along with strip switches 38a and 38b. These switches are the typical type as illustrated before in the sequence of FIGS. 5A through 5D, where an underlying aperture allows the interruption to be made by a pin 17a, Thus, for example, assuming the circuit direction is indicated as "in" if it is desired to connect to the underside conductor 46 only, then switch 38a is opened. If connection is desired to be just maintained with the upper conductor 47 and not the opposite underside 46, then switch 38b is opened.

Thus, referring to FIG. 8 again, if a straight through connection is desired, then the connection to the underside conductor 46 is opened; that is, switch 38b. Thus, the switching illustrated in FIG. 9A is implemented. In FIG. 8 this closed switch 38a, is indicated away from the plated through conductor 48 for convenience. The foregoing is illustrated in FIG. 9A, where switches 38a are closed and the switches 38b interrupt the underside conductors 46 and thus interrupt conductive connection to the adjacent left and right switch arrays.

Next, left or right turns are illustrated in FIGS. 9B and 9C. Here the switches 38a would be interrupted as illustrated. However, switches 38b cannot be interrupted since it must continue in the plated through connection 48 to the underside 46. Thus, as illustrated in FIG. 8, there are a second set of plated through switches 48' and 48" which include only one of the switches 38a or 38b as illustrated in FIG. 10, and these may be selectively interrupted as illustrated in FIGS. 9B and 9C.

FIG. 12 is an alternative master grid embodiment where a grid, besides consisting of the switch arrays 24, also includes line switches 51. These line switches form a part of the conductive path between the various switch arrays, and are for the purpose of remapping the parallel conductors of the adjacent switch array.

FIG. 13A is a typical line switch format before switching and FIG. 13B illustrates the detail of a particular line switch 51 after being switched. The left input side of 6 conductors are designated sequentially 1 through 6, and then on the output right side are the conductors as they have been physically remapped. This is provided by a matrix of conductors 52 on the upper side of the insulating layer 58 in solid line, and conductors 53 which are perpendicular in orientation on the underside of the flexible insulating layer in dashed lines.

Again the purpose of the line switch 51 is to remap the arrangement of the matrix of parallel conductors as they proceed from one switch array 24 to another. Thus, as illustrated in FIG. 13B, the initial conductors are designated sequentially 1, 2, 3, 4, 5, 6, and are remapped to produce the sequence 6, 5, 2, 1, 3,4.

In general, the same type of plated through switch as illustrated in FIG. 10 is utilized for the cross-over switches from the top to the bottom surface which occur where the upper and underside conductors 52, 53 cross.

As illustrated, there are four different conditions that plated through switch of FIG. 10, which is rally illustrated at 56 at a typical intersection of two conductors 52, 53. These conditions are that the switch 38b, may be open or closed, or the strip line conductor switch 38a may be open or closed. The appropriate legends are shown in FIG. 13B.

In order to provide sufficient flexibility in the routing or remapping, it is necessary because of the particular topology and the use of the plated through switches to have for each line 52, a parallel alternate line 52'.

The foregoing line switch technique is useful for interconnecting various electrical components which may have different line designations or be non-standard from one another. In other words, it provides greatly added flexibility. Of course, the components would be installed on the adjacent connection pads to each switch array 24, as illustrated in FIG. 12.

An alternative technique for installing components is illustrated in FIG. 14A, where the unused area of the insulating material caused by the insertion of the line switches 51 provide a component mounting area. (CMA 61). In fact as is clear from an inspection of FIG. 12, there are several possible circuit mounting areas which can be provided on the master grid. In order to implement the circuit mounting area, referring again back to FIG. 14A, the line switches are provided with circuit mounting pads 62 (in the specific example 7 pads are illustrated) which, in combination with the other line switches illustrated in FIG. 14A form a border for the circuit mounting area 61.

In actual practice, to utilize the component mounting area, an adapter board 63 would be attached as illustrated in FIG. 14B having connection pads 62' by a suitable attachment technique, such as the use of a solder flux in combination with pads 62. Then a typical integrated circuit component 64 can be plugged in to the standard fixture of the adapter board 63. The output of the adapter board similarly interfaces with one of the other sets of pads which are in turn connected to another line switch. This capability allows the use of many lines which location and interface properly with a desired component. Moreover, because of the remapping available by the line switch, a wide variety of integrated circuits can be installed. Thus, this in effect is a universal interface to many different types of integrated circuit components or for that matter discrete circuit components.

In actual practice, the pads 62 for the line switches 51 would be installed by plated through connections to the underside conductors 53 of the line switches. Thus, for illustrative purposes if FIG. 13B were to be utilized as a line switch connecting to a component mounting area 61, then the inputs 1, 2, 3, 4, 5, 6, would connect respectively to underside conductors 53 in the order 3,2,1,6,5,4. This is indicated in parenthesis in the drawing. Note that these connections with the topside conductors 53 are via the plated through connections as indicated by the solid dots. When the line switch 51 is used for this purpose, then, of course, the output end would normally be interrupted by breaking the strip conductors as shown by the "x's."

Thus, there has been provided an improved method of producing a flexible circuit. A flexible circuit master grid can be utilized to produce, on a production basis, any desired configuration of flexible circuit without the need of a custom design and the expensive processing thereafter. It is also apparent that a paper mock-up may be outline punched by substituting a paper roll for roll 10, to initially determine the accuracy and form fit of the design.

Figure 15:
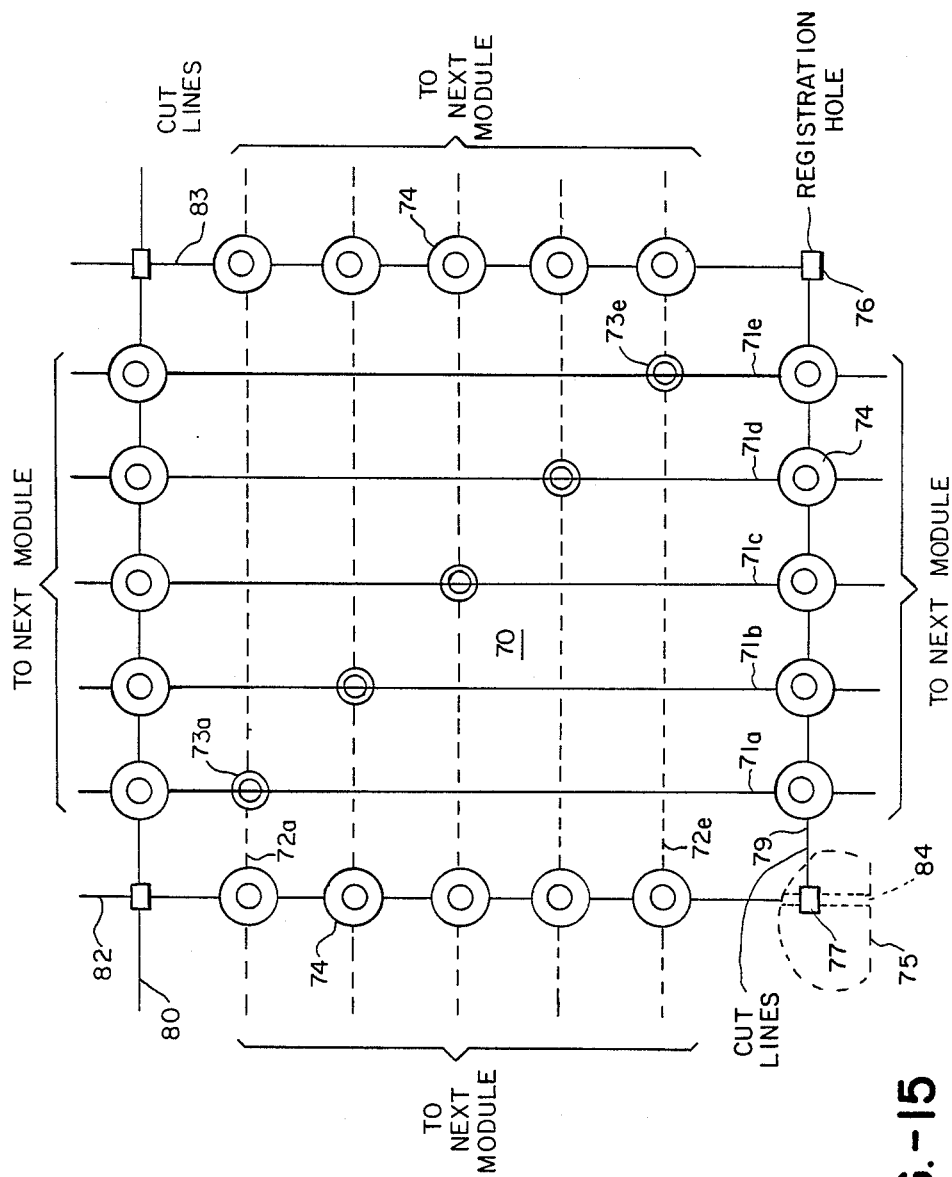
FIG. 15 is a plan view of one of the arrays on modules of an alternative embodiment of the invention.

FIG. 15 illustrates an alternative embodiment of an array or module of a master grid which is simplified in comparison to the equivalent array of FIG. 4 in that it does not include switching elements or, more generally, a means for selectively interrupting a conductive path. The module or array includes a flexible insulating layer or base 70 on the front side which is placed a first parallel set of conductors 71a through 71e. A second orthogonal set of conductors 72a–72e is on the reverse or other side of the insulating layer. The front conductors are connected to the back side conductor through a diagonal row of plated through holes 73a through 73e. Thus, each conductor of the first set 71 is connected to the corresponding conductor of the second set 72. Each module or array includes conductive pads 74 for all of the conductors. They are plated through so that a connection may be made to a conductor on either side of the flexible insulating layer 73.

Finally each module on its four corners has a registration hole 76 which fits on a post 77 which extends from a hard base 75 on which the material is laid for fabrication of the final flexible circuit.

Figure 16:
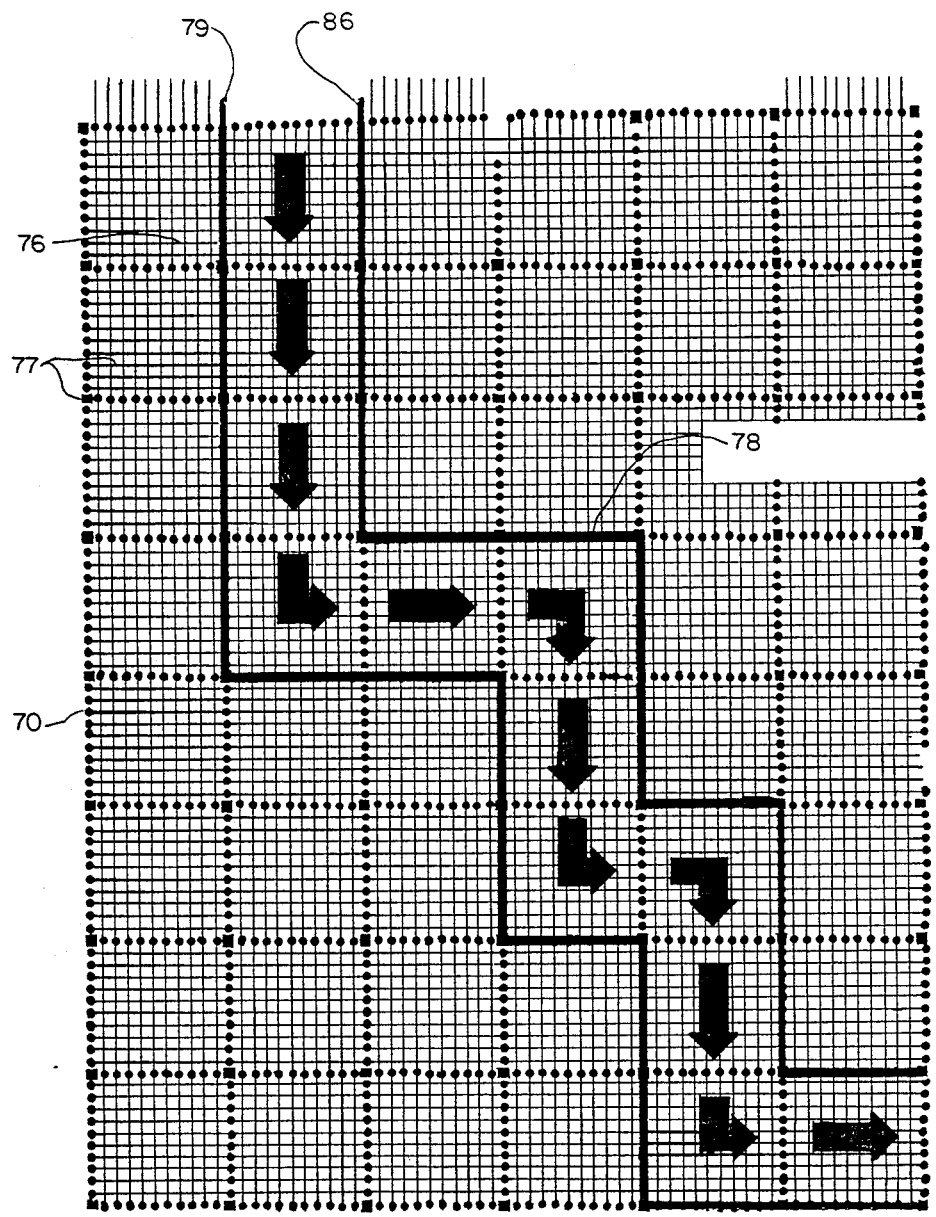
FIG. 16 is a plan view of an alternative embodiment of a flexible circuit master grid.

The module indicated is connected by an extension of the conductors 71 and 72 to the next modules adjacent to it, as illustrated in FIG. 16. Here there is illustrated a master grid where there are six columns of modules across and eight columns down. A typical module is indicated at 77 and is electrically connected (at least in the master grid format) to the left and right adjacent modules via the contact pads 74 associated with conductors 72, as better illustrated in Figure 15, and to the modules at its top and bottom via the contact pads 74 associated with the conductors 71. Thus to form an actual flexible circuit from the master grid, as illustrated in FIG. 16, all that is required is merely physically cutting by means of a knife, for example, adjacent modules apart to form the planar pattern 78, as illustrated by the darkened cut lines 79 and 80. In the case of the typical module 77 these cut lines are shown as 82 and 83 in FIG. 15 as occurring vertically and going across the contact pads 74 associated with the horizontal conductors 72. Other horizontal cut lines 79 and 80 go through the pads 74 associated with the vertical conductor 71. For the process of cutting itself the base 75 can, besides including a post 77 upon which the registration holes 76 lie, include the groove 84 for accepting a cutting knife and providing a clean cut.

Therefore, with the alternative master grid of FIG. 16 a flexible circuit can be configured merely by cutting the flex part on any of the module boundary lines. The circuit will extend to the cut edge of the flex part as illustrated in FIG. 15 and thus needs to be protected from short circuiting which can be accomplished by application of an insulating coating to the cut edges. Each module or array is equivalent to a three-way hard wired switch. When the user makes the necessary cut, only the undesired circuit paths are being eliminated. The module size also fixes the minimum distance possible between circuit directional changes and establishes the maximum number of lines available to the user for a single module. The selection of the proper module size is a tradeoff between the maximum number of lines available to the user and the granularity (distance between directional changes) capability of the flexible master grid.

With the above technique, potentially very high line densities of conductors are possible since no punching is necessary to configure the flexible circuit. Line widths as small as five mils with 20 mil spacings are achievable without any great difficulty. In addition, conductor widths and thicknesses can be as large as required for the purpose of routing power lines. The conductor widths can be as large as desired up to and including a solid copper sheet which would be in essence one conductor. The conductor thicknesses are limited only by the ability of the user to make the necessary cuts required to form the final flexible circuit and also the acceptability of the flexibility of the final circuit.

Figure 17:
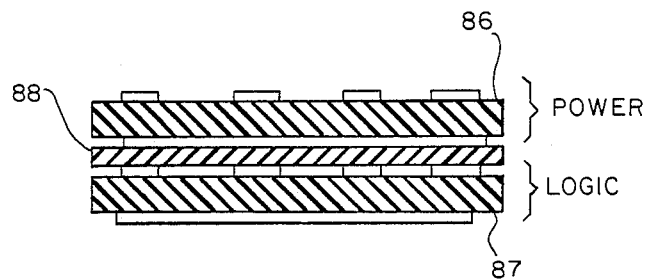
FIG. 17 is a cross-sectional view of a flexible circuit showing an alternative embodiment.

As illustrated in FIG. 17, two or more flexible circuits of the same planar configuration can be stacked together to form a multi-layer part. Thus, for example, the circuit of FIG. 16 can be duplicated with a similar planar configuration by the step of cutting another flexible circuit from the same master grid; and then the two can be sandwiched together, as shown by the circuits 86 and 87. When this is done, an insulating layer 88 should be provided. Two layers may not actually require exactly the same type of circuit configuration but only a similar type. Typically, the sandwich would be fixed together by suitable adhesive. The layers, as indicated in FIG. 17, might include a power layer, a logic layer, and for that matter, other layers such as a grounding layer and control line layer. The same flex material could be used or even a different type of flexible master grid. The only characteristic that is duplicated on each of the levels is the grid pattern of the modules which is repeated in each level. This repeating may be done with higher or lower granularity depending on the type of circuit being used. Pins can be used to make interconnects between layers if this type of interconnect is required.

Figure 18:
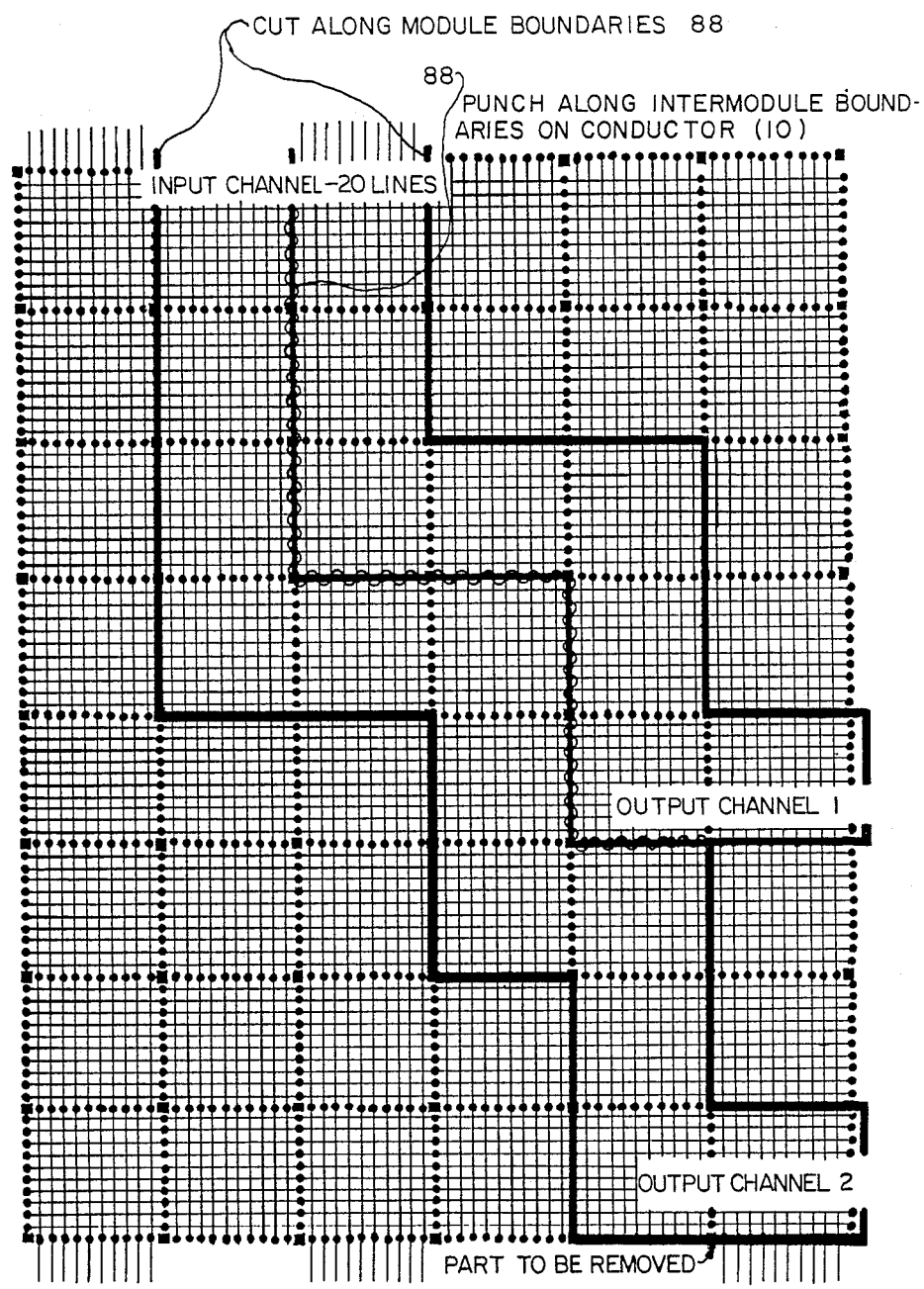
FIG. 18 is similar to the master grid of FIG. 16 but showing an alternative method.

If more lines are desired than are available in a single module, then multiple adjacent modules can be used as shown in FIG. 18. In effect, two modules are run in parallel with one being designated output channel 1 and the second output channel 2 (as shown in the master grid, each containing ten lines). With this type of flexible circuit, the connection between adjacent modules or arrays, must be eliminated by specifically cutting the conductive connection; that is, the connection along the intermodular boundary designated as 88. This however, would only be done across the actual circuit interconnections at, for example, 74, illustrated in FIG. 15, in order to leave sufficient flexible base material 70 to maintain the structural integrity of the flexible circuit. Thus, a knife type of cutting cannot be used; rather the punching technique described above in connection with FIG. 2 and 3 may be utilized.

Figure 19:
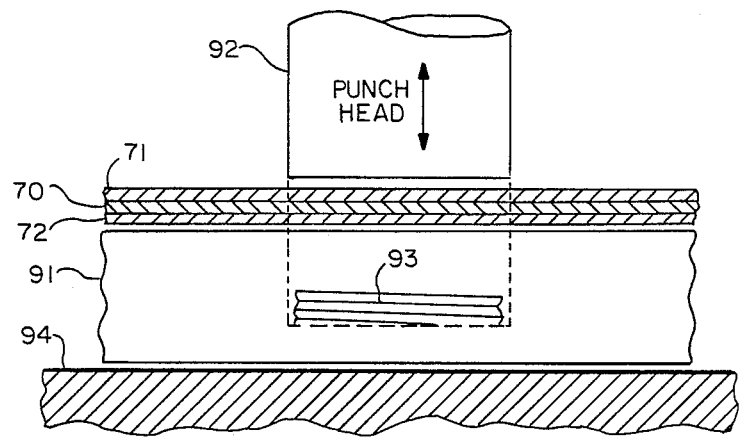
FIG. 19 is a simplified cross-sectional view of apparatus used for punching to accomplish the method of at least the alternative embodiment of FIG. 18.

FIG. 19 illustrates an alternative punching technique where rather than the use of a punch and a die, as illustrated in FIG. 3, a flexible base material 91 is utilized which is thicker than the flexible insulating material 70 with its conductors 71 and 72 by approximately a factor of 3 to 4 times. The punch head 92 then moves through the flexible base material 70 cutting out a punched out portion 93 which is then imbedded in the backing material 91, which is typically a vinyl material. A hard surface base 94 would, of course, be utilized. Here the punch can be placed anywhere the user desires and there is no requirement to align a punch and die. Backing material 91 which is of inexpensive vinyl may of course be removed and discarded after each use. This punching system can be utilized, for that matter, instead of the punch illustrated in FIGS. 2 and 3 and has the advantage of potentially high punching rates over the punch and die system. Also, there is no requirement to move the material over the die; there are potentially very small punch sizes; no die is required; and it is relatively low cost.

Thus, in summary, the alternative technique illustrated in FIGS. 15 through 18 using in essence a cut and form method provides a very simplified method of making a flexible circuit. However, the technique illustrated in FIGS. 1 through 14 is still useful where more complex flexible circuits are required or where the signals or power being carried must not terminate on the cut edge of the flexible circuit.

What is claimed is:

1. A method of producing a flexible circuit for use in interconnecting electrical components having a flexible insulating layer carrying conductor strips said layer being cut in a predetermined planar pattern to provide a circuit path comprising the following steps:
   providing a grid pattern of switch arrays on said flexible insulating layer, all of which lie in a common plane, with each of said switch arrays having a matrix of parallel conductors electrically connected by conductive path means to conductor matrices of adjacent switch arrays;
   selectively interrupting some of said conductive path means to at least one of said adjacent switch arrays whereby a circuit path is established by the remaining uninterrupted conductive path means;
   and physically separating a portion of said flexible insulating layer carrying said circuit path to form said planar pattern whereby the remainder constitutes a flexible circuit having said pattern.

2. A method as in claim 1 including the step of perforating said insulating layer adjacent to said switch arrays in said established circuit path to provide for said physical separation.

3. A method as in claim 1 including the step or providing a paper mock-up pattern of said flexible circuit before said step of selectively interrupting.

4. A method as in claim 1 where included in said grid patterns are line switches formed as strip conductors on said flexible insulating layer forming part of said conductive path means between adjacent switch arrays and including the step of utilizing said line switches to remap the arrangement of the matrix of parallel conductors between a pair of switch arrays.

5. A method as in claim 1 where there are, in said planar grid pattern, at least three adjacent switch arrays with respect to some of said switch arrays and where in said interrupting step said conductive path means is interrupted for two of said adjacent switch arrays.

6. A flexible circuit master grid comprising:
   an elongated flexible insulating layer;
   a grid pattern of switch arrays on said flexible insulating layer, all of which lie in a common plane, with each of said switch arrays having a matrix of parallel conductors electrically connected by conductive path means to conductor matrices of adjacent switch arrays, each of said switch arrays including means for selectively interrupting some of said conductive path means to at least one of said adjacent switch arrays whereby a circuit path is established by the remaining uninterrupted conductive means.

7. A flexible circuit master grid as in claim 5 where said elongated layer is a continuous roll having said grid pattern thereon.

8. A flexible circuit master grid as in claim 7 wherein said grid pattern includes a plurality of line switch means carried by said insulating layer and located between adjacent switch arrays forming part of said conductive means for allowing remapping of said parallel conductors of said switch arrays.

9. A flexible circuit master grid as in claim 8 including a circuit mounting area on said insulating layer and where said line switch means include circuit connection pad means adjacent to said circuit mounting area on said insulating layer for connection to electrical circuit components mounted on said area.

10. A flexible circuit master grid as in claim 6 where said interrupting means includes an aperture through said insulating layer underlying each of said matrix of parallel conductors.

11. A flexible circuit master grid comprising:
    an elongated flexible insulating layer;
    a grid pattern of conductive arrays on said flexible insulating layer, said grid pattern being composed of a checkerboard-like arrangement of said arrays with a typical array having other adjacent arrays at its top and bottom and left and right all lying in the same plane;
    each of said arrays having first and second parallel sets of conductors with the sets being orthogonal and with said first set on one side of said flexible insulating layer and said second set on the other side of said flexible insulating layer;
    connecting means extending through said insulating layer for respectively permanently connecting each conductor of said first set of conductors of each of said arrays to a corresponding conductor of said second set of conductors of said same array;
    said master grid including means for electrically interconnecting said typical array to said other arrays above and below and to the left and right.

12. A circuit master grid as in claim 11 where said means for interconnecting said arrays includes
    contact pads associated with each conductor of said first and second set.

13. A method of providing a flexible circuit from a master grid as described in claim 11 comprising the step of physically cutting adjacent arrays apart to form a predetermined planar pattern including the step of cutting said means for electrically interconnecting said arrays.

14. A method as in claim 13 where said master grid includes registration holes and where a base with posts is provided and including the step of placing said master grid on said posts before cutting.

15. A method as in claim 14 where said cutting is done by punching and where said base includes a soft backing and including the step of punching through said master grid to permanently embed the punched out portion in said soft backing.

16. A method as in claim 13 including the step of cutting another flexible circuit from said master grid in addition and similar to said one and in a similar planar configuration and sandwiching said two flexible circuits together with electrical insulation between them.

* * * * *